(12) United States Patent
Hernandez Gamazo et al.

(10) Patent No.: US 6,298,106 B1
(45) Date of Patent: Oct. 2, 2001

(54) FREQUENCY SYNTHESISER

(75) Inventors: José Miguel Hernandez Gamazo; Tomás Motos Lopez; Carlos Martinez Fernandez; Victor Manuel Cortijo Fernandez; Pablo Antonio Garcia Gil, all of Madrid (ES)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/324,857

(22) Filed: Jun. 3, 1999

(30) Foreign Application Priority Data

Jun. 17, 1998 (ES) ................................................. 9801279

(51) Int. Cl.[7] ............................................................. H03D 3/24
(52) U.S. Cl. ........................... 375/376; 455/76; 455/260; 332/127; 327/159
(58) Field of Search ..................................... 375/376, 373; 455/76, 260; 332/127; 331/34; 327/156, 159; 377/47, 48

(56) References Cited

U.S. PATENT DOCUMENTS

| | | | |
|---|---|---|---|
| 4,516,083 | * 5/1985 | Turney | 331/1 A |
| 4,573,023 | * 2/1986 | Cok et al. | 331/1 A |
| 5,815,042 | * 9/1998 | Chow et al. | 331/57 |
| 6,005,904 | * 12/1999 | Knapp et al. | 375/376 |
| 6,066,990 | * 5/2000 | Genest | 331/25 |
| 6,081,164 | * 6/2000 | Shigemori et al. | 331/16 |

\* cited by examiner

Primary Examiner—Stephen Chin
Assistant Examiner—Lenny Jiang
(74) Attorney, Agent, or Firm—Sughrue, Mion, Zinn, Macpeak & Seas, PLLC

(57) ABSTRACT

The present invention relates to a frequency synthesizer for generating an output signal (So) the frequency of which has a non-integer, fractional relationship of value Nn/Nd, where Nn and Nd are integer numbers, with respect to a frequency (fr) of an input signal (Sr). The synthesizer is characterized in that it comprises a device for multiplying by M, where M is an integer number, the frequency of the input signal in order to produce a high frequency intermediate signal (Si), and a device for dividing the frequency of this intermediate signal by (M×Nd)/Nn in order to generate the output signal (So).

4 Claims, 2 Drawing Sheets

FREQUENCY SYNTHESISER

OBJECT OF THE INVENTION

The present invention relates to a frequency synthesizer. More specifically, the present invention relates to a frequency synthesizer with a non-integer, fractional relationship between the input signal frequency and the output signal frequency, that is, the respective input and output frequencies are not multiples of each other.

STATE OF THE ART

With reference to FIG. 1, the patent U.S. Pat. No. 5,267,189 describes a fractional frequency synthesiser comprising two dividers 10 and 12 and a PLL (phase locked loop) 11. The input reference signal Sr is applied to a first input of the PLL 11 through the frequency divider 10. A second input of the PLL receives the output signal of the PLL 11 through the frequency divider 12. The PLL 11 comprises typically a phase comparator, a filter and a voltage controlled oscillator, or equivalent circuits of the type described in the patent U.S. Pat. No. 5,267,189, incorporated in this application by reference. The comparator compares the phases of the two output signals from the dividers 10 and 12, respectively, in order to produce a control signal that is applied to an input of the voltage controlled oscillator, VCO, through the filter. The purpose of the comparator in the PLL is to correct the frequency difference between the frequency of the output signal of the divider 12 and the frequency of the output signal of the divider 10. The result being that if F is the frequency of the reference signal and if M and N are the division coefficients of the dividers 10 and 12, respectively, the output signal So has a frequency F×(N/M).

With reference to FIG. 1, the patent U.S. Pat. No. 5,267,189 describes a fractional frequency synthesizer comprising two dividers 10 and 12 and a PLL (phase locked loop) 11. The input reference signal Sr is applied to a first input of the PLL 11 through the frequency divider 10. A second input of the PLL receives the output signal of the PLL 11 through the frequency divider 12. The PLL 11 comprises typically a phase comparator, a filter and a voltage controlled oscillator, or equivalent circuits of the type described in the patent U.S. Pat. No. 5,267,189, incorporated in this application by reference. The comparator compares the phases of the two output signals from the dividers 10 and 12, respectively, in order to produce a control signal that is applied to an input of the voltage controlled oscillator, VCO, through the filter. The purpose of the comparator in the PLL is to correct the frequency difference between the frequency of the output signal of the divider 12 and the frequency of the output signal of the divider 10. The result being that if F is the frequency of the reference signal and if M and N are the division coefficients of the dividers 10 and 12, respectively, the output signal So has a frequency F×(N/M).

CHARACTERIZATION OF THE INVENTION

A first object of the present invention is to provide a frequency synthesizer with a non-integer fractional relationship between the input signal frequency and the output signal frequency, capable of being incorporated into an integrated circuit.

A second object of the present invention is to obtain a synthesizer with an instantaneous phase shift as small as possible, that is, each of the periods of the resulting signal at the output of the synthesizer shall have a duration as close as possible to their nominal value, satisfying the condition that the sum of the duration of a certain number of consecutive periods be equal to that of the same number of nominal periods.

Consequently, a synthesizer for generating a digital output signal the frequency of which has a fractional relationship of value Nn/Nd, where Nn and Nd are integers numbers, with respect to the frequency of a digital input signal, is characterized in that it comprises a frequency multiplier to multiply by M, where M is an integer number, the input signal frequency in order to generate a high frequency intermediate signal and means to divide by (M×Nd)/Nn the frequency of this intermediate signal in order to generate said output signal.

The process of multiplying the input signal frequency by M and subsequently dividing the resulting signal frequency by (M×Nd)/Nn permits very restricted phase fluctuations in the output signal from the synthesiser without the need to have a very selective filter in the PLL. There are certain applications that tolerate clock generation having this phase uncertainty in the output signal.

For example, the frequency multiplier comprises a PLL the first input of which receives the input signal and the output of which is applied to a second input of the PLL through a modulus M frequency divider.

According to a first embodiment, M is such that (M×Nd)/Nn is an integer number.

BRIEF DESCRIPTION OF THE FIGURES

A more detailed explanation of the present invention is provided in the following description, based on the attached figures, in which.

DESCRIPTION OF THE INVENTION

Figure 1:
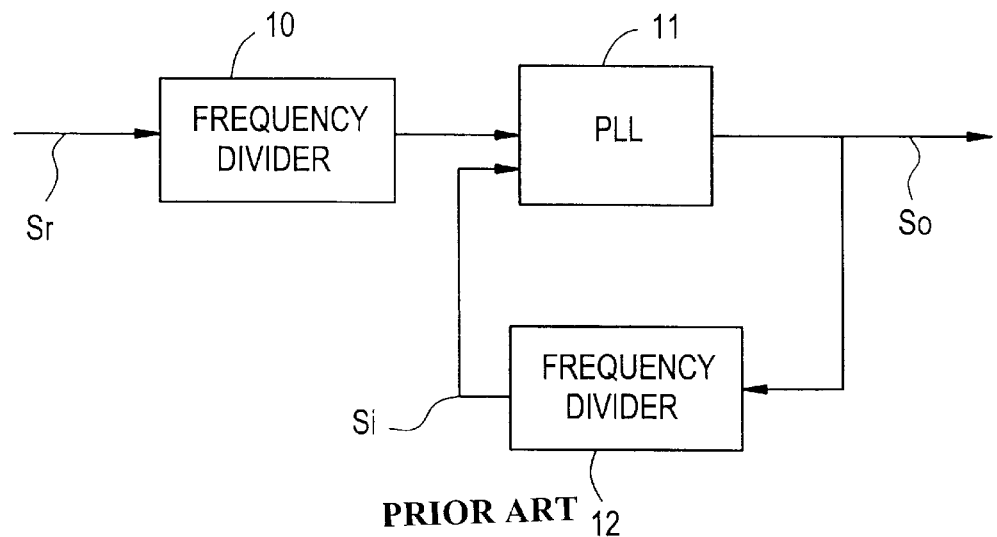
FIG. 1 shows a frequency synthesizer according to the state of the art.
Figure 2:
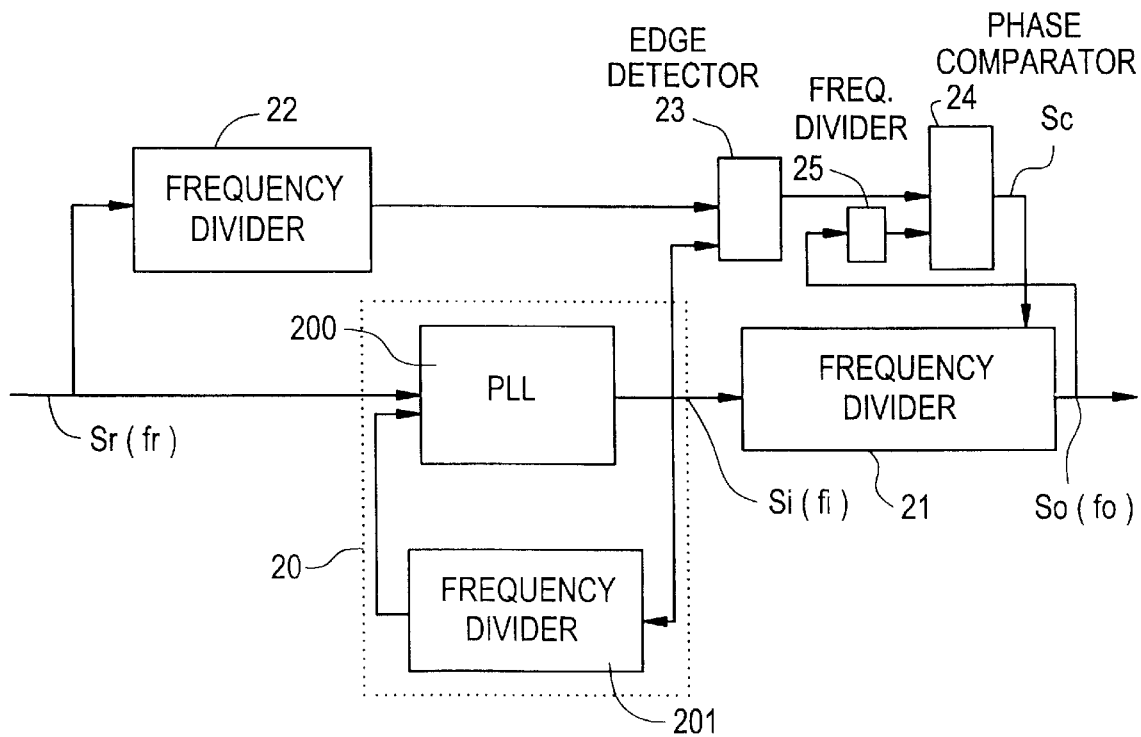
FIG. 2 shows a frequency synthesizer according to the present invention.

With reference to FIG. 2, a frequency synthesizer according to the present invention comprises a frequency multiplier 20, a first frequency divider 21, as well as a phase control circuit comprising a second frequency divider 22, an edge detector 23 and a digital phase comparator 24. According to the embodiment of the present invention shown in FIG. 2, the frequency multiplier 20 comprises a PLL 200 (phase locked loop) the first input of which receives the input signal Sr and the output of which is applied to a second input of the PLL 200 through a modulus M frequency divider 201. The output signal Si of the frequency multiplier 20 is applied to an input of the digital frequency divider 21 which performs the division of the frequency of signal Si by (M×Nd)/Nn.

In parallel the input signal Sr is applied to an input of the second frequency divider 22, the output of which is connected to a first input of the edge detector 23. A second input of the edge detector 23 receives the output signal Si of the frequency multiplier 20. A first input of the phase comparator 24 is connected to an output of the frequency divider 21 through a modulus Nn frequency divider 25, a second input of the phase comparator 24 receives the signal produced by the edge detector 23 and an output of the comparator is applied to a write input of the frequency divider 21

The object of the synthesizer according to the present invention is to divide the frequency fr of the input signal Sr by Nd/Nn, the use of the frequency multiplier 20 offering benefits in each of the two embodiments that are described below.

According to a first embodiment it is possible to choose the coefficient M of the multiplier 20 in such a way that (M×Nd)/Nn is an integer number. In this case, the first frequency divider 21 performs a whole number division, facilitating its design.

Figure 3:
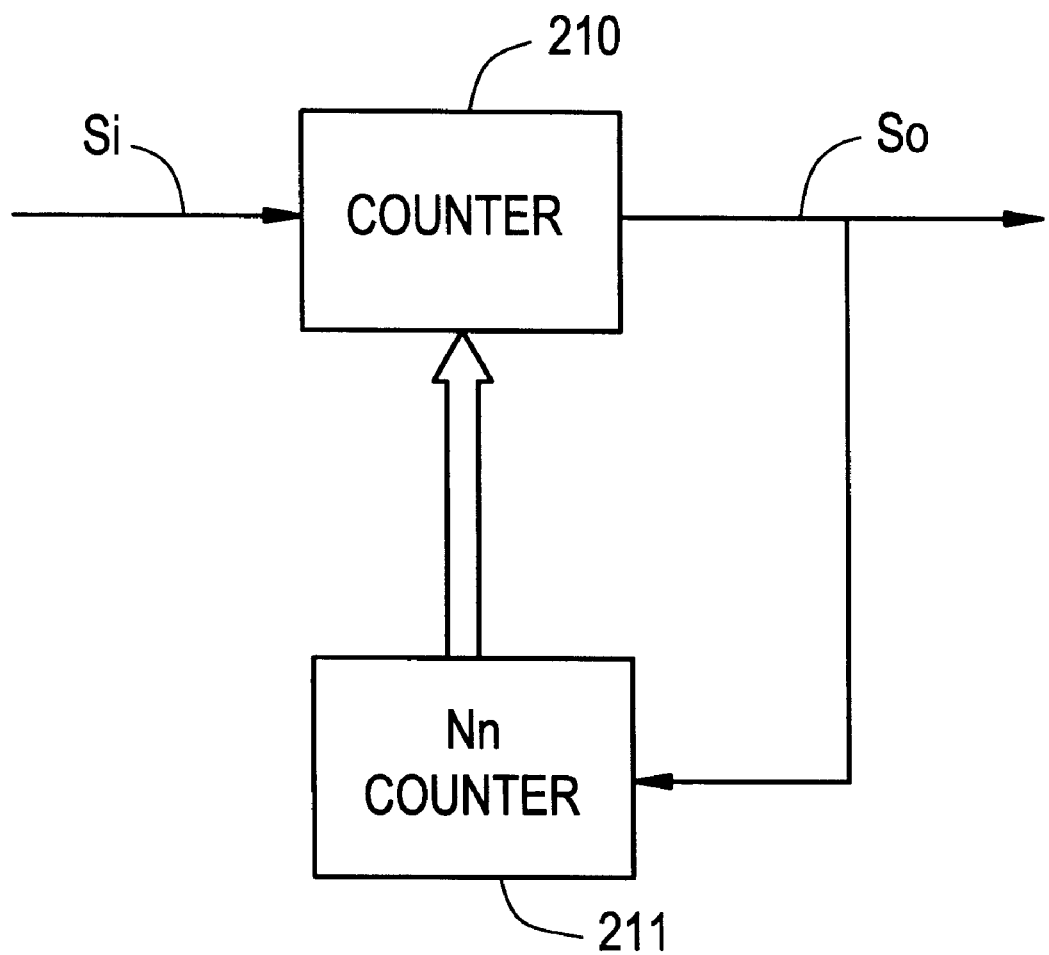
FIG. 3 is a block diagram of a first frequency divider included in the frequency synthesizer of FIG. 2.

According to a second embodiment, (M×Nd)/Nn may not be an integer number, but a fractional one. In this case, the action of increasing the frequency of the input signal Sr by a factor M, making use of the multiplier 20, permits the first frequency divider 21 to generate the output signal, or clock signal, So, with good phase accuracy because of the high temporal resolution permitted by the high frequency of signal Si. With reference to FIG. 3, according to this second embodiment, the first divider 21 comprises a first counter 210 which generates a normal clock cycle every P pulses of the intermediate signal Si, where P is the integer part of the division of M×Nd by Nn, and a second counter 211 to count numbers of clock cycles generated by the first counter 210, and to "force" the generation of Q additional clock cycles every Nn clock cycles generated by said first counter 210, where Q is the remainder of the division of M×Nd by Nn.

The second counter 211 receives the signal So and forces the counter 210 to generate clock cycles So with a duration equal to the nominal duration of So (duration of signal So when the frequency of signal Si is divided by P) plus the duration of one clock cycle Si for Q of every Nn cycles of clock So.

Actually, there are two options. For example, P+Q/Nn can be written as:

P+Q/Nn=7+9/11, or it can be written as:

P+Q/Nn=8 −2/11

According to the first option, the counter 210 has to generate a cycle of nominal clock So every 7 cycles of Si, but the counter 211 forces the counter 210 in such a manner that for 9 of every 11 So cycles, 8 cycles of the signal Si are counted by counter 210 for the generation of one cycle of signal So.

According to the second option, the counter 210 has to generate a cycle of nominal clock So every 8 cycles of Si, but the counter 211 forces the counter 210 in such a manner that for 2 of every 11 So cycles, 7 cycles of the signal Si are counted by counter 210 for the generation of one cycle of signal So.

The synthesiser according to the present invention can additionally comprise the phase control circuit 22, 23, 24 for correcting the phase of the output signal So at intervals of time defined by Nd/fr, whereby the latter is adapted to the phase of the input signal Sr at said moments in time. The frequency divider 22 divides the frequency of the signal Sr by Nd. A first input of the edge detector 23 receives the output signal of the divider 22 and a second input of the edge detector 23 receives the signal Si with the frequency fi. The edge detector 23, for example in the form of a sampling circuit for the signal at frequency fr/Nd with the signal Si, generates a signal the binary value of which changes each time an edge is detected in the output signal of the frequency divider 22. Thus, the phase of the output signal of the edge detector 23 coincides with the phase of the signal Si. The digital phase comparator 24 receives, on one hand, the output signal of the edge detector 23 and, on the other, the output signal of the divider 21 through the divide by Nn circuit 25. The output of the divider 25 generates a signal having the same frequency, fr/Nd, as the output signal from the edge detector 23. The phase comparator 24 compares the phases of these two signals, respectively, and generates a control signal Sc to "adjust" the contents of counter 210 in the divider 21 such that the phase of signal So coincides with the phase of signal Sr. This control signal Sc acts to block, punctually, the increment in the count of counter 210 or to force said increment by means of the signal Si, respectively, depending on whether the binary value of the control signal Sc is "1" or "0".

With the solution presented in the above description, the output frequency of the divider 201 is sufficiently high to enable said PLL to be integrated relatively easily into an ASIC, the rest of the synthesizer being digital and directly implementable. In this way, it is possible to incorporate the whole of the synthesizer in a single integrated circuit without having recourse to board-mounted external components (resistors, capacitors).

What is claimed is:

1. A synthesizer that generates a digital output signal the frequency of which has a fractional relationship of value Nn/Nd, where Nn and Nd are integers, with respect to the frequency of a digital input signal, characterized in that said synthesizer comprises a frequency multiplier to multiply by a modulus M, where M is an integer number, the frequency of said input signal in order to produce a high frequency intermediate signal, and a divider that divides by (M×Nd)/Nn, the frequency of said intermediate signal, in order to produce said output signal, and further characterized in that (M×Nd)/Nn is not an integer number and in that the divider comprises a first counter that generates a clock cycle every P pulses of the intermediate signal, P being the integer part of the division of M×Nd by Nn, and a second counter that counts the number of clock cycles generated by the first counter and forces the generation of Q clock cycles for every Nn clock cycles generated by said first counter, where Q is the remainder of the division of M×Nd by Nn.

2. The synthesizer according to claim 1, characterized in that said frequency multiplier comprises a PLL the first input of which receives the input signal and the output of which is applied to a second input of the PLL through a modulus M frequency divider.

3. The synthesizer according to claim 1, characterized in that M is such that (M×Nd)/Nn is an integer number.

4. The synthesizer according to claim 1, characterized in that it comprises a device that corrects the phase of the output signal at intervals of time equal to Nd/fr, where fr is the frequency of the input signal, by controlling a counter in said divider.

* * * * *